(12) United States Patent
Tsuchiya et al.

(10) Patent No.: US 10,062,814 B2
(45) Date of Patent: Aug. 28, 2018

(54) METHOD OF MANUFACTURING LIGHT EMITTING DEVICE WITH MULTIPLE LIGHT EMITTING ELEMENTS WHICH ARE SIMULTANEOUSLY CONNECTED TO MOUNTING BOARD IN FLIP CHIP MANNER

(71) Applicant: TOYODA GOSEI CO., LTD., Kiyosu-shi (JP)

(72) Inventors: Yosuke Tsuchiya, Kiyosu (JP); Yuhki Ito, Kiyosu (JP); Aya Kawaoka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 40 days.

(21) Appl. No.: 15/341,761

(22) Filed: Nov. 2, 2016

(65) Prior Publication Data

US 2017/0125644 A1    May 4, 2017

(30) Foreign Application Priority Data

Nov. 4, 2015  (JP) .................................. 2015-216312

(51) Int. Cl.
*H01L 33/60* (2010.01)
*H01L 33/48* (2010.01)

(52) U.S. Cl.
CPC ............ *H01L 33/486* (2013.01); *H01L 33/60* (2013.01); *H01L 2224/16225* (2013.01); *H01L 2933/0033* (2013.01); *H01L 2933/0058* (2013.01)

(58) Field of Classification Search
CPC ............ H01L 21/6802; H01L 23/5384; H01L 23/5385; H01L 23/5226; H01L 23/5383; H01L 23/49811
See application file for complete search history.

(56) References Cited

U.S. PATENT DOCUMENTS

| 8,017,956 B2 | 9/2011 | Furuyama |
| 8,399,894 B2 | 3/2013 | Furuyama |
| 8,758,546 B2 * | 6/2014 | Ishigami ................. H01L 24/29 156/289 |

(Continued)

FOREIGN PATENT DOCUMENTS

| JP | 2010-165754 A | 7/2010 |
| JP | 2013-001792 A | 1/2013 |

*Primary Examiner* — Benjamin Sandvik
(74) *Attorney, Agent, or Firm* — McGinn I.P. Law Group, PLLC.

(57) ABSTRACT

A method of manufacturing a light emitting device, includes: temporarily connecting light emitting elements to a wiring layer through connection members, the wiring layer being formed on a mounting board provided with reflectors; contacting a pressing surface of a press-bonding jig with upper surfaces of the light emitting elements and pressing the light emitting elements toward the mounting board while being heated at the same time to deform the connection members and to contact the pressing surface with tops of the reflectors; and connecting the light emitting elements to the wiring layer in a flip chip manner, wherein when the light emitting elements are temporarily connected to the wiring layer, a sum of height of a light emitting element of the light emitting elements and a connection member of the connection members is set to be larger than a height of a reflector of the reflectors.

20 Claims, 7 Drawing Sheets

(56) References Cited

U.S. PATENT DOCUMENTS

| | | | |
|---|---|---|---|
| 8,772,062 B2* | 7/2014 | Chen | H01L 33/62 |
| | | | 438/27 |
| 9,412,920 B2* | 8/2016 | Ooyabu | H01L 33/46 |
| 2002/0121706 A1* | 9/2002 | Tatsuta | H01L 21/563 |
| | | | 257/778 |
| 2011/0180818 A1* | 7/2011 | Lerman | H01L 25/0753 |
| | | | 257/88 |
| 2016/0126429 A1* | 5/2016 | Mahowald | H01L 33/505 |
| | | | 257/98 |

* cited by examiner

METHOD OF MANUFACTURING LIGHT EMITTING DEVICE WITH MULTIPLE LIGHT EMITTING ELEMENTS WHICH ARE SIMULTANEOUSLY CONNECTED TO MOUNTING BOARD IN FLIP CHIP MANNER

CROSS-REFERENCE TO RELATED APPLICATION(S)

This application is based upon and claims the benefit of priority from Japanese Patent Application No. 2015-216312, filed on Nov. 4, 2015, the entire contents of which are incorporated herein by reference.

BACKGROUND

1. Field of the Invention

The present invention relates to a method of manufacturing a light emitting device and, more particularly, to a method of manufacturing a light emitting device in which multiple light emitting elements are simultaneously connected to one mounting board in a flip chip manner.

2. Description of the Related Art

JP-A-2010-165754 discloses a technology for connecting multiple light emitting diodes (LEDs) to one mounting board in a flip chip manner.

JP-A-2013-1792 discloses a technology for disposing LED elements on a mounting board formed with reflectors and pressing a phosphor sheet against the LED elements using a heating-pressing tool.

In the related art, when multiple LED chips are connected to one mounting board, a press-bonding jig (heating-pressing tool) is used to simultaneously heat and press all of the LED chips.

At this time, when a separate reflector is disposed for each LED chip on a mounting board, it is necessary to press only the LED chip using the press-bonding jig while avoiding the reflector, and thus it is necessary to prepare a press-boding jig according to the dimensional shape or an arrangement state of the LED chips.

For this reason, according to the technologies of the related art, there have had problems in that various press-bonding jigs have to be manufactured depending on packages of light emitting devices in which the reflectors are different in the dimensional shape or the LED chips are different in the arrangement state, and that manufacturing costs are increased.

SUMMARY

The invention has been made to solve the above problems and an object thereof is to provide a method of manufacturing a light emitting device in which multiple light emitting elements can be simultaneously connected to one mounting board in a flip chip manner.

The present inventors have studied to solve the above problems and, as a result, have conceived each aspect of the invention as described below.

According to a first aspect of the invention, there is provided a method of manufacturing a light emitting device, including: temporarily connecting light emitting elements to a wiring layer through connection members, the wiring layer being formed on a mounting board provided with reflectors, each of the reflectors being corresponding to each of light emitting elements; contacting a substantially flat pressing surface of a press-bonding jig with upper surfaces of the light emitting elements and pressing the light emitting elements toward the mounting board, using the press-bonding jig, while being heated at the same time to deform the connection members and to contact the substantially flat pressing surface of the press-bonding jig with tops of the reflectors; and removing the press-bonding jig and connecting the light emitting elements to the wiring layer through the connection members, which are held in a shape being deformed, in a flip chip manner, wherein when the light emitting elements are temporarily connected to the wiring layer, a sum of height of a light emitting element of the light emitting elements and a connection member of the connection members is set to be larger than a height of a reflector of the reflectors, and an upper surface of the light emitting element protrudes from a top of the reflector.

According to the first aspect, the upper surface of the light emitting element protrudes from the top of the reflector. For this reason, it is possible to simultaneously press the plurality of light emitting elements using the substantially flat pressing surface of the press-bonding jig in the second step.

According to the first aspect, since the press-bonding jig having the substantially flat pressing surface is used, the same press-bonding jig can be commonly used regardless of the dimensional shape of the reflectors or the arrangement state of the LED chips. Accordingly, it is not necessary to prepare a variety of pressing-bonding jigs depending on the package of the light emitting devices, and thus manufacturing costs can be reduced.

A second aspect of the invention provides the method of manufacturing the light emitting device according to the first aspect, wherein: when the light emitting elements are temporarily connected to the wiring layer, a substantially flat plate is placed on the upper surface of the light emitting element; and the substantially flat pressing surface of the press-bonding jig is contacted with an upper surface of the substantially flat plate; and when the light emitting elements are pressed toward the mounting board through the substantially flat plate using the press-bonding jig while being heated at the same time, the connection members are deformed and thus a lower surface of the substantially flat plate is brought into contact with tops of the reflectors.

According to the second aspect, since the press-bonding jig comes in contact with the upper surfaces of the light emitting elements through the plate, it is possible to prevent malfunction of the light emitting elements due to addition of excessive heat to the light emitting elements from the press-bonding jig while preventing the upper surfaces of the light emitting elements from being damaged by the press-bonding jig.

A third aspect of the invention provides the method of manufacturing the light emitting device according to the second aspect, wherein the plate has softness.

According to the third aspect, when there is variation in the height of the upper surface of the plurality of light emitting elements, the variation in the height can be absorbed by the plate having softness, and thus it is possible to reliably connect the plurality of light emitting elements in a flip chip manner.

A fourth aspect of the invention provides the method of manufacturing the light emitting device according to the second aspect or the third aspect, wherein a thermosetting or heat-softening bonding material is applied to the lower surface of the substantially flat plate, and the substantially flat plate is bonded and fixed to the light emitting elements and the reflectors through the bonding material heated with the light emitting elements.

According to the fourth aspect, a process of bonding and fixing the plate to the light emitting elements and the reflectors is not separately required, and thus manufacturing costs are not increased. In addition to this, reliable bonding and fixing can be easily realized.

A fifth aspect of the invention provides the method of manufacturing the light emitting device according to the second aspect or the third aspect, further including: removing the plate after connecting the light emitting elements to the wiring layer.

According to the fifth aspect, the light emitting device not including the plate can be obtained.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1A:
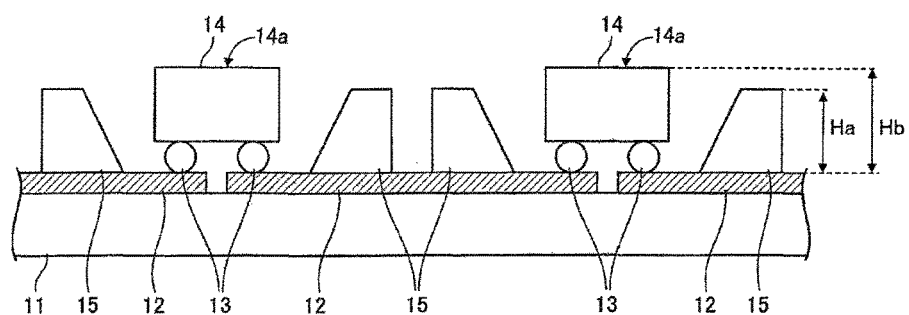
FIGS. 1A to 1C are longitudinal sectional views for describing schematically a method of manufacturing a light emitting device 10 according to a first embodiment.

Hereafter, each of the embodiments embodying the invention will be described in detail with reference to the accompanying drawings. In each of the embodiments, the same parts and constituent members are denoted by the same reference numeral and a duplicated description thereof will not be presented.

In each of the drawings, for the purpose of easily understanding the description, the size, shape and arrangement of the constituent member in each of the embodiments are schematically illustrated in an exaggerated manner. Further, the size, shape and arrangement of the constituent members may not always correspond to those of the real thing.

First Embodiment

With respect to a method of manufacturing a light emitting device 10 according to a first embodiment, each of steps will be described.

Step 1 (see FIG. 1A): A wiring layer 12 is formed on a flat surface of a mounting board 11.

A connection member (bonding member) 13 is placed on the wiring layer 12, an LED chip 14 is placed on the connection member 13, and the LED chip 14 is temporarily connected (temporarily bonded) to the wiring layer 12 through the connection member 13.

An upper surface 14a of the LED chip 14 is formed in a substantial flat shape.

A separate reflector 15 is disposed on a surface of the mounting board 11 including the wiring layer 12 for each of several LED chips 14, and the LED chip 14 is surrounded by the reflector 15.

An inner peripheral wall surface of the reflector 15 is inclined such that a cross-sectional area of the reflector 15 is increased toward an opening of the reflector 15. For this reason, radiated light of the LED chip 14 is reflected by the inner peripheral wall surface of the reflector 15, and is efficiently radiated from the opening of the reflector 15.

An example of the connection member 13 may include a bump, a metal paste, a metal nano paste, or an anisotropic conductive bonding agent.

The reflector 15 is formed of, for example, a ceramic material (aluminum oxide, aluminum nitride, or the like) or a synthetic resin material (epoxy resin, silicon resin, polyphthalamide resin, nylon resin, or the like).

Herein, the sum of height Hb of the LED chip 14 and the connection member 13 is set to be larger than a height Ha of the reflector 15 (Hb>Ha).

Therefore, each of the LED chips 14 has the upper surface 14a protruding from a top (upper part) of the reflector 15.

The height Hb is a dimension from the surface of the wiring layer 12 to the upper surface 14a of the LED chip 14.

In addition, the height Ha is a dimension from the surface of the wiring layer 12 to the top of the reflector 15.

Figure 1B:
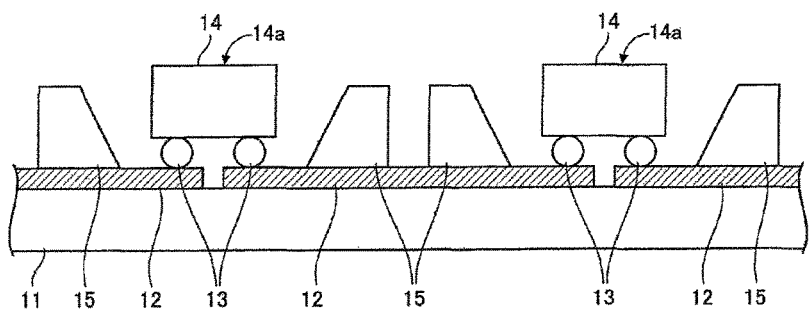

Step 2 (see FIG. 1B): A substantially flat pressing surface 16a of a press-bonding jig 16 faces downward, and the pressing surface 16a is brought into contact with the upper surface 14a of the respective LED chips 14.

Consequently, the pressing surface 16a of the press-bonding jig 16 and the upper surface 14a of the respective LED chips 14 are located on the same virtual plane.

Figure 1C:
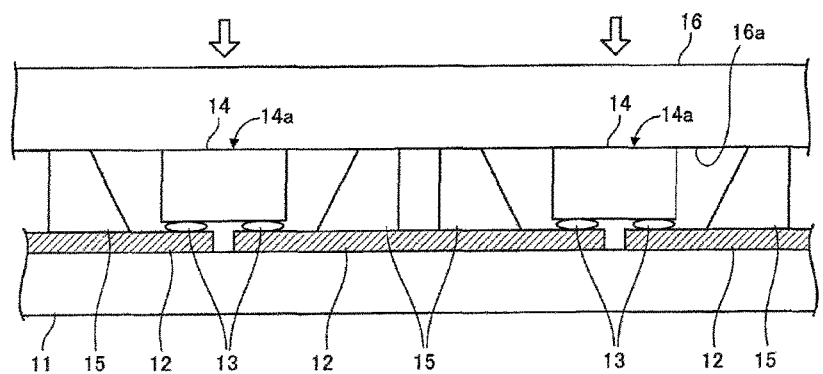

Step 3 (see FIG. 1C): When the LED chips 14 are pressed toward the mounting board 11 using the press-bonding jig 16 while being heated at the same time, the connection member 13 is deformed, and thus the pressing surface 16a of the press-bonding jig 16 is brought into contact with the top of respective reflectors 15.

Figure 2A:
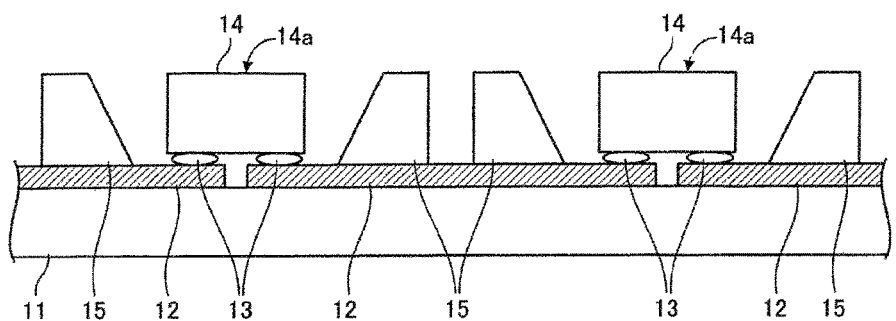
FIGS. 2A and 2B are longitudinal sectional views for describing schematically a method of manufacturing the light emitting device 10 according to the first embodiment.

Step 4 (see FIG. 2A): When the press-bonding jig 16 is removed, the connection member 13 is held in a shape being deformed in Step 3.

Consequently, the LED chips 14 are connected to the wiring layer 12 through the connection members 13 in a flip chip manner, and thus the wiring layer 12 and the LED chips 14 are electrically and mechanically interconnected using the connection members 13.

Figure 2B:
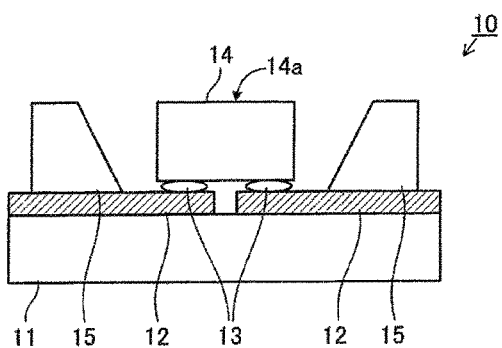

Step 5 (see FIG. 2B): The mounting board 11 and the wiring layer 12 are subjected to a dicing process, and the respective light emitting devices 10 are divided by cutting.

Operation and Effect of First Embodiment

In the method of manufacturing the light emitting device 10 according to the first embodiment, the upper surface of the respective LED chips 14 protrudes from the top of the respective reflectors 15 in Step 1 (first step). For this reason, each of the LED chips 14 can be simultaneously pressed by the substantially flat pressing surface 16a of the press-bonding jig 16 in Step 3 (second step).

According to the first embodiment, since the press-bonding jig 16 having the substantially flat pressing surface 16a is used, the same press-bonding jig 16 can be commonly used regardless of the dimensional shape of the respective reflectors 15 or the arrangement state of the respective LED chips 14. Accordingly, it is not necessary to prepare a variety of pressing-bonding jigs according to the package of the light emitting devices 10, and thus manufacturing costs can be reduced.

Figure 3A:
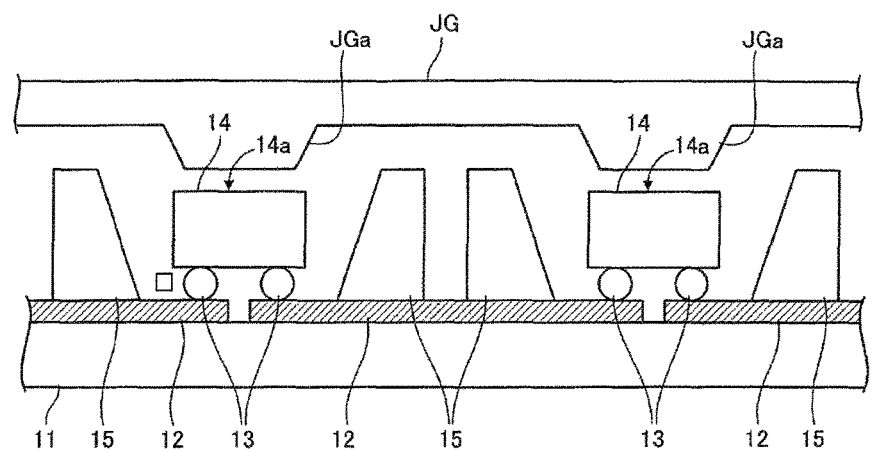
FIGS. 3A and 3B are longitudinal sectional views for describing schematically a method of manufacturing a light emitting device 10 according to the related art.
Figure 3B:
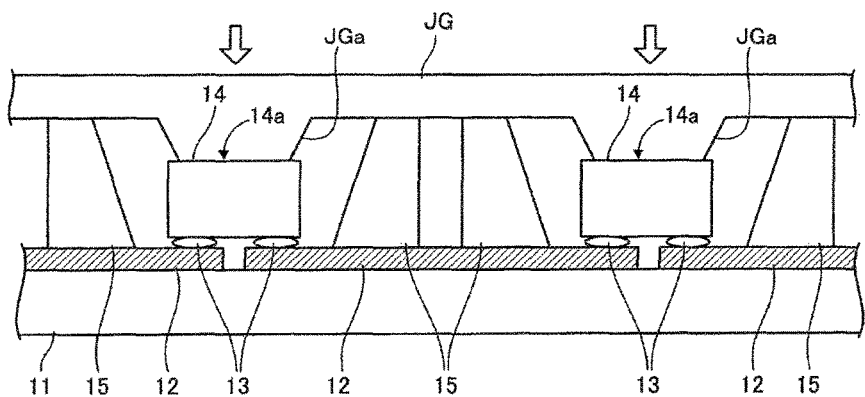

In contrast, since a press-bonding jig JG is required to press only the respective LED chips 14 so as to avoid the respective reflectors 15 in the related art illustrated in FIGS. 3A and 3B, it is necessary to prepare the press-bonding jig JG having a convex portion JGa in accordance with the dimensional shape of the respective reflectors 15 or the arrangement state of the respective LED chips 14.

Therefore, according to the related art, there are problems that it is necessary to prepare a variety of press-bonding jigs JG having the convex portions JGa which are different in the dimensional shape or the arrangement state, depending on the package of the light emitting devices 10 in which the respective reflectors 15 are different in the dimensional shape or the respective LED chips 14 are different in the arrangement state, and that manufacturing costs are increased.

According to the first embodiment, it is possible to solve the problems of such a related art.

Second Embodiment

With respect to a method of manufacturing a light emitting device 10 according to a second embodiment, each of steps will be described.

Figure 4A:
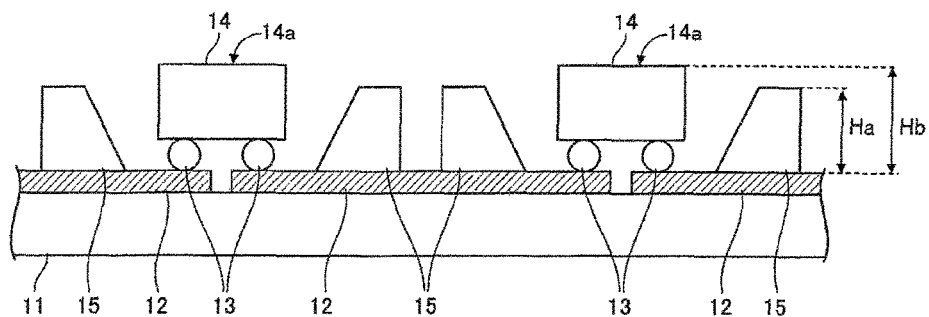
FIGS. 4A to 4C are longitudinal sectional views for describing schematically a method of manufacturing a light emitting device 10 according to a second embodiment.

Step 1 (see FIG. 4A): This is the same as Step 1 in the first embodiment.

Figure 4B:
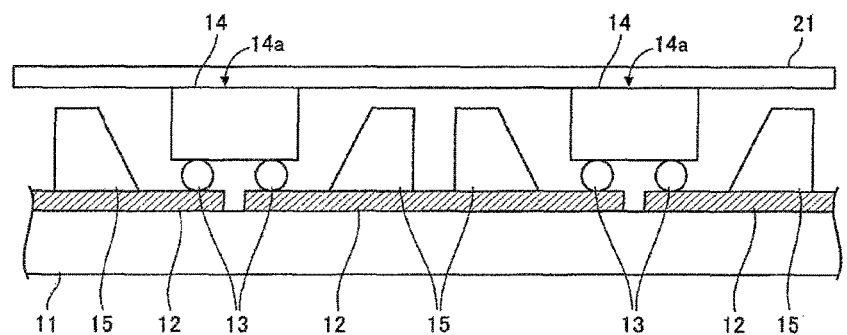

Step 2 (see FIG. 4B): One plate 21 is prepared of which both upper and lower surfaces are formed substantially in a flat shape, and the plate 21 is mounted on an upper surface 14a of respective LED chips 14.

Figure 4C:
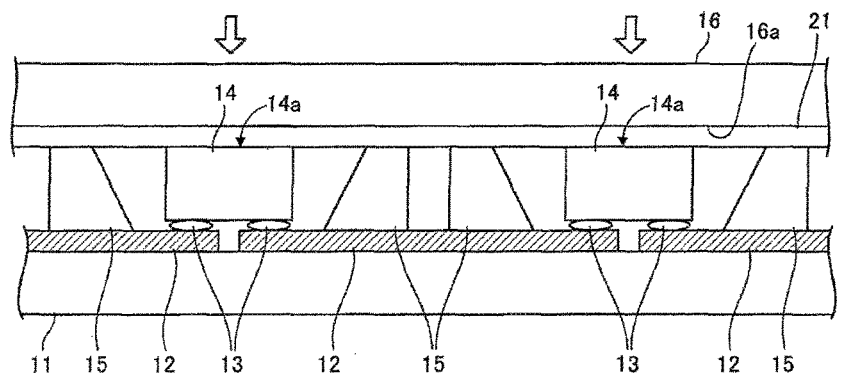

Step 3 (see FIG. 4C): A substantially flat pressing surface 16a of a press-bonding jig 16 faces downward, and the pressing surface 16a is brought into contact with the upper surface of the plate 21.

Consequently, the pressing surface 16a of the press-bonding jig 16 and the upper surface of the plate 21 are located on the same virtual plane.

Then, when the respective LED chips 14 are pressed toward a mounting board 11 through the plate 21 using the press-bonding jig 16 while being heated at the same time, a connection member 13 is deformed, and thus the lower surface of the plate 21 is brought into contact with the top of respective reflectors 15.

Step 4 (not illustrated): When the press-bonding jig 16 is removed as in Step 4 according to the first embodiment, the connection member 13 is held in as shape as being deformed in Step 3, and thus the LED chips 14 are connected to a wiring layer 12 through the connection member 13 in a flip chip manner. Then, the plate 21 is removed.

Step 5 (not illustrated): This is the same as Step 5 in the first embodiment.

The second embodiment is the same as the first embodiment except for including the plate 21.

Accordingly, the same operation and effect as in the first embodiment can also be obtained in the second embodiment.

According to the second embodiment, since the press-bonding jig 16 comes in contact with the upper surface 14a of the respective LED chips 14 through the plate 21, it is possible to prevent malfunction of the respective LED chips 14 due to addition of excessive heat to the respective LED chips 14 from the press-bonding jig 16 while preventing the upper surface 14a of the respective LED chips 14 from being damaged by the press-bonding jig 16.

According to the second embodiment, since the plate 21 is removed in Step 4, the light emitting device 10 not including the plate 21 is obtained.

Incidentally, according to the second embodiment, if the plate 21 having softness is used, when there is variation in the height of the upper surface 14a of the respective LED chips 14, the variation in the height can be absorbed by the softness of the plate 21, and thus it is possible to reliably connect the respective LED chips 14 in a flip chip manner.

The degree of the softness of the plate 21 may be set to experimentally required optimum value such that the respective LED chips 14 are reliably pressed after the variation in the height of the respective LED chips 14 is absorbed.

Third Embodiment

With respect to a method of manufacturing a light emitting device 30 according to a third embodiment, each of steps will be described.

Figure 5A:
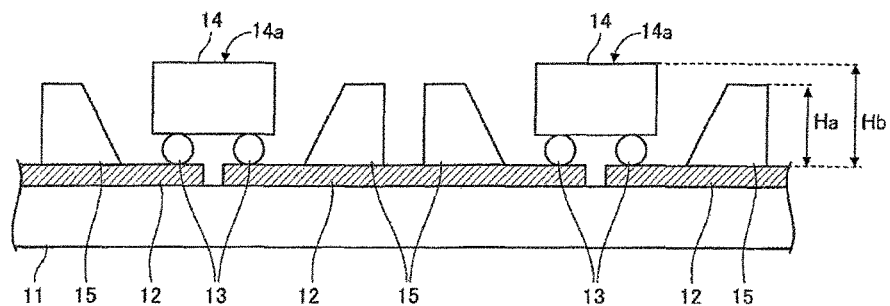
FIGS. 5A to 5C are longitudinal sectional views for describing schematically a method of manufacturing a light emitting device 30 according to a third embodiment.

Step 1 (see FIG. 5A): This is the same as Step 1 in the first embodiment.

Figure 5B:
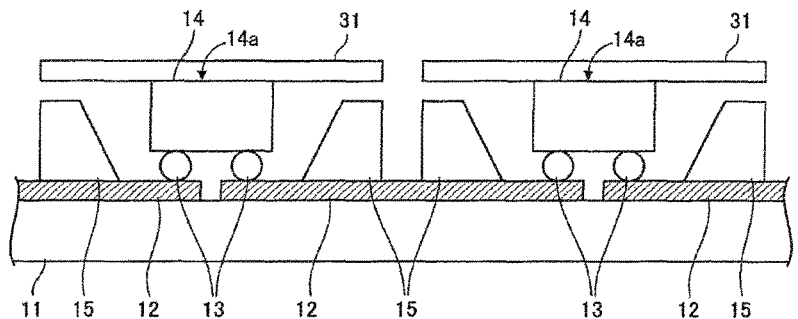

Step 2 (see FIG. 5B): A phosphor plate 31 is separately prepared for each LED chip 14, and the phosphor plate 31 is mounted on an upper surface 14a of the respective LED chips 14.

Both upper and lower surfaces of the phosphor plate 31 are formed substantially in a flat shape.

The phosphor plate 31 is formed of a transparent material (for example, a synthetic resin material or glass material) containing fine particles of a phosphor (for example, a YAG (Yttrium Aluminum Garnet) type), and functions as a wavelength conversion member (wavelength conversion layer).

Figure 5C:
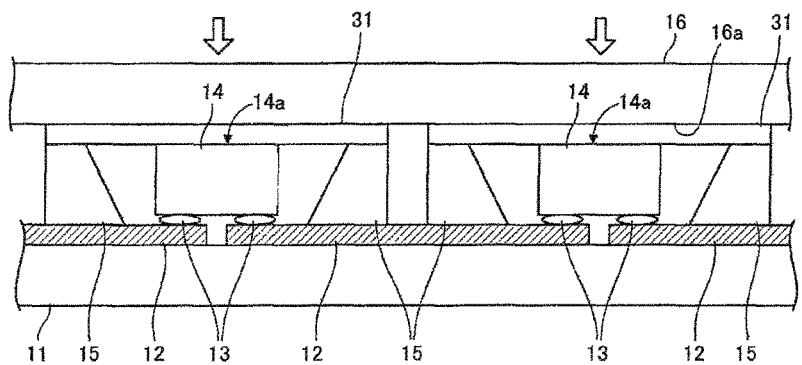

Step 3 (see FIG. 5C): A substantially flat pressing surface 16a of a press-bonding jig 16 faces downward, and the pressing surface 16a is brought into contact with the upper surface of the respective phosphor plates 31.

Consequently, the pressing surface 16a of the press-bonding jig 16 and the upper surface of the respective phosphor plates 31 are located on the same virtual plane.

Then, when the respective LED chips 14 are pressed toward a mounting board 11 through the respective phosphor plates 31 using the press-bonding jig 16 while being heated at the same time, a connection member 13 is deformed, and thus the lower surface of the respective phosphor plates 31 is brought into contact with the top of respective reflectors 15.

Figure 6A:
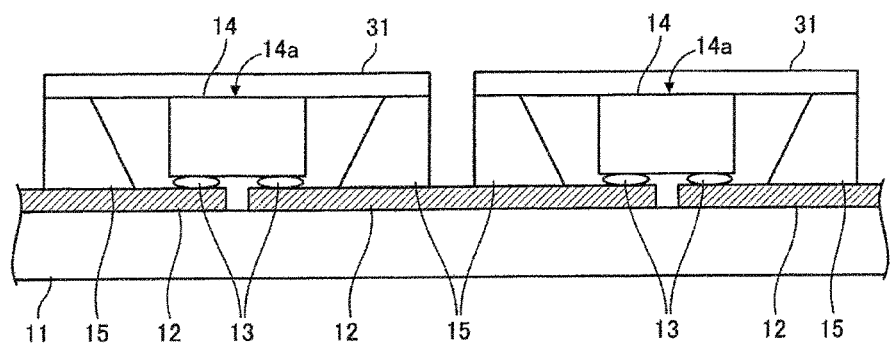
FIGS. 6A and 6B are longitudinal sectional views for describing schematically the method of manufacturing the light emitting device 30 according to a second embodiment.

Step 4 (see FIG. 6A): When the press-bonding jig 16 is removed as in Step 4 according to the first embodiment, the connection member 13 is held in as shape as being deformed in Step 3, and thus the LED chips 14 are connected to a wiring layer 12 through the connection member 13 in a flip chip manner.

Figure 6B:
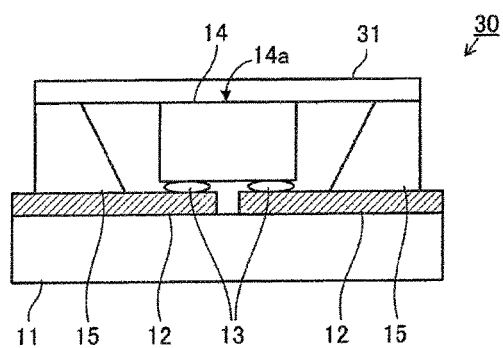

Step 5 (see FIG. 6B): The mounting board 11 and the wiring layer 12 are subjected to a dicing process, the respective light emitting devices 10 are divided by cutting.

In the light emitting device 30, white light is generated by mixture of primary light (blue light) radiated from the LED chip 14 and secondary light (yellow light) that a part of the primary light excites the phosphor contained in the phosphor plate 31 and thus the wavelength thereof is converted, and the white light is radiated from a surface of the phosphor plate 31, that is, a light radiating surface of the light emitting device 30.

In order that the LED chip 14 and the reflector 15 are fixed integrally with the phosphor plate 31 in the light emitting device 30, the LED chip 14 and the reflector 15 may be bonded and fixed to the phosphor plate 31 through a bonding material applied to the lower surface of the phosphor plate 31.

In a case of using a thermosetting or heat-softening bonding material, when each of the phosphor plates 31 is pressed and heated by the press-bonding jig 16 in Step 3, the phosphor plate 31 can be bonded and fixed to the LED chip 14 and the reflector 15 through the heated bonding material. Thus, a process of bonding and fixing the phosphor plate 31 to the LED chip 14 and the reflector 15 is not separately required, and thus manufacturing costs are not increased. In addition to this, reliable bonding and fixing can be easily realized.

Incidentally, the phosphor plate 31 is separately formed for each of the LED chips 14 in the third embodiment. However, one phosphor plate may be placed on the upper surface 14a of the respective LED chips 14 to cover the respective LED chips 14 in Step 2, and the dicing process may be performed on the phosphor plate in addition to the mounting board 11 and the wiring layer 12 in Step 5.

In addition, the phosphor plate 31 may be replaced with a transparent plate not containing a phosphor.

Fourth Embodiment

With respect to a method of manufacturing a light emitting device 10 according to a fourth embodiment, each of steps will be described.

Figure 7A:
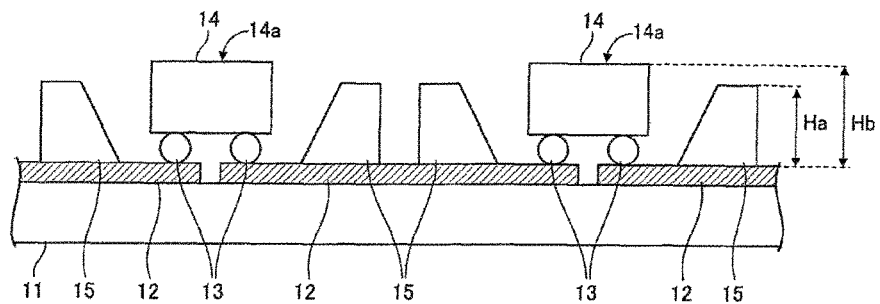
FIGS. 7A to 7C are longitudinal sectional views for describing schematically a method of manufacturing a light emitting device 10 according to a fourth embodiment.

Step 1 (see FIG. 7A): This is the same as Step 1 in the first embodiment.

Figure 7B:
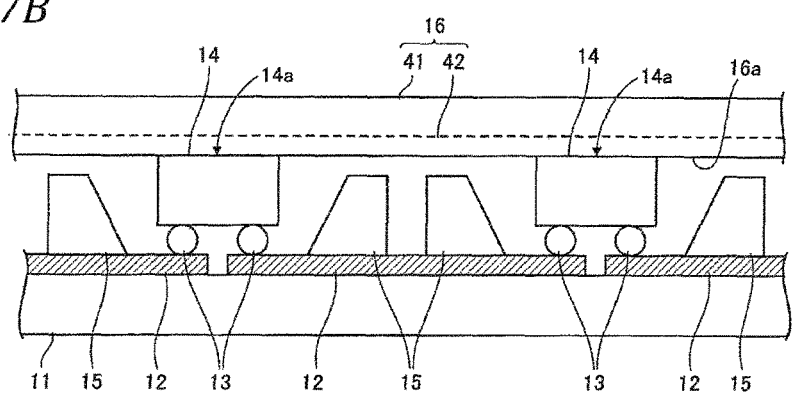

Step 2 (see FIG. 7B): This is the same as Step 2 in the first embodiment. Here, a press-bonding jig 16 has a laminated structure of a hard base 41 and a soft pressing portion 42, and a surface of the pressing portion 42 is a pressing surface 16a.

Figure 7C:
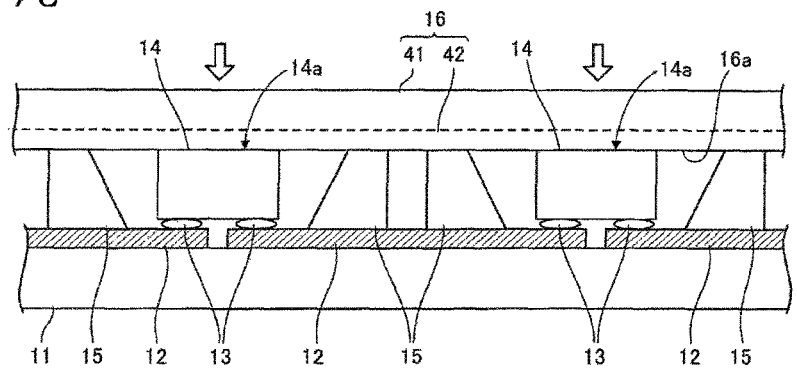

Step 3 (see FIG. 7C): This is the same as Step 3 in the first embodiment.

Steps 4 and 5 (not illustrated): These are the same as Steps 4 and 5 in the first embodiment.

The fourth embodiment is the same as the first embodiment except that the press-bonding jig 16 has the laminated structure of the hard base 41 and the soft pressing portion 42.

Accordingly, the same operation and effect as in the first embodiment can also be obtained in the fourth embodiment.

When there is variation in the height of the upper surface 14a of the respective LED chips 14, the variation in the height can be absorbed by the soft pressing portion 42 of the press-bonding jig 16, and thus it is possible to reliably connect the respective LED chips 14 in a flip chip manner.

The degree of the softness of the pressing portion 42 may be set to experimentally required optimum value such that the respective LED chips 14 are reliably pressed after the variation in the height of the respective LED chips 14 is absorbed.

Other Embodiments

The invention is not limited to the foregoing respective embodiments, and may also be embodied in the following manner. Even in this case, an operation and an effect equal to or better than the respective embodiments can be obtained.

[A] A sealing material is filled between the reflector 15 and the LED chip 14 and the connection member 13, and thus the LED chip 14 and the connection member 13 may be sealed.

[B] The LED chip 14 may be replaced with any semiconductor light-emitting element (for example, an EL (Electro Luminescence) chip or an LD (Laser Diode) chip).

[C] The invention may be implemented by appropriately combining the respective embodiments and the above [A] and [B]. In this case, the operation and effect of the combined embodiments can be additionally obtained or synergy effects can be obtained.

Supplementary Notes Based on the Description of Embodiments

Technical ideas that can be understood from the embodiments and other embodiments described above are listed below.

[Supplementary Note 1] The light emitting device described in any one of aspects 2 to 5, wherein the plate is a phosphor plate that is formed of a transparent material containing fine phosphor particles.

According to Supplementary Note 1, white light is generated by mixture of primary light (blue light) radiated from the light emitting device and secondary light (yellow light) that a part of the primary light excites the phosphor contained in the phosphor plate and thus the wavelength thereof is converted, and the white light is radiated from a surface of the phosphor plate, that is, a light radiating surface of the light emitting device.

Therefore, it is possible to manufacture a white light emitting device at low cost using the phosphor plate as a plate.

[Supplementary Note 2] The light emitting device described in aspect 1, wherein the press-bonding jig has a laminated structure of a hard base and a soft pressing portion, and a surface of the pressing portion is the pressing surface.

According to Supplementary Note 2, when there is variation in the height of the upper surface of multiple light emitting elements, the variation in the height can be absorbed by the soft pressing portion of the press-bonding jig, and thus it is possible to reliably connect the multiple light emitting elements in a flip chip manner.

The invention is not limited to the description of the above-described aspects, embodiments, and supplementary Notes. Various modifications that can be easily and conceptually reached by a person skilled in the art without departing from the description of the scope of the above-described aspects, embodiments, supplementary Notes, and claims are also included in the invention. All the contents of the publications and the like indicated in the specification are incorporated herein by reference.

What is claimed is:

1. A method of manufacturing a light emitting device, the method comprising:
 temporarily connecting light emitting elements to a wiring layer through connection members, the wiring layer being formed on a mounting board on which reflectors are mounted, each of the reflectors being corresponding to each of the light emitting elements;
 contacting a substantially flat pressing surface of a press-bonding jig with upper surfaces of the light emitting elements and pressing the light emitting elements toward the mounting board, using the press-bonding jig, while being heated at a same time to deform the connection members and to contact the substantially flat pressing surface of the press-bonding jig with tops of the reflectors; and removing the press-bonding jig and connecting the light emitting elements to the wiring layer through the connection members, which are held in a shape being deformed, in a flip chip manner, wherein, when the light emitting elements are temporarily connected to the wiring layer, a sum of heights of a light emitting element of the light emitting elements and a connection member of the connection members is set to be larger than a height of a reflector of the reflectors, and an upper surface of the light emitting element is positioned higher than the top of the reflector.

2. The method of manufacturing the light emitting device according to claim 1, wherein, when the light emitting elements are temporarily connected to the wiring layer, a substantially flat plate is placed on the upper surface of the light emitting element, wherein the substantially flat pressing surface of the press-bonding jig is contacted with an upper surface of the substantially flat plate, and wherein, when the light emitting elements are pressed toward the mounting board through the substantially flat plate using the press-bonding jig while being heated at the same time, the connection members are deformed and a lower surface of the substantially flat plate is brought into contact with tops of the reflectors.

3. The method of manufacturing the light emitting device according to claim 2, wherein the flat plate is flexible.

4. The method of manufacturing the light emitting device according to claim 2, wherein a thermosetting or a heat-softening bonding material is applied to a lower surface of the substantially flat plate, and the substantially flat plate is bonded and fixed to the light emitting elements and the reflectors through the bonding material heated with the light emitting elements.

5. The method of manufacturing the light emitting device according to claim 2, further comprising:

removing the flat plate after connecting the light emitting elements to the wiring layer.

6. The method of manufacturing the light emitting device according to claim 1, wherein the substantially flat pressing surface of the press-bonding jig abuts tops of the reflectors.

7. The method of manufacturing the light emitting device according to claim 1, wherein, prior to the removing the press-bonding jig, the substantially flat pressing surface of the press-bonding jig abuts the tops of the reflectors and the upper surfaces of the light emitting elements.

8. The method of manufacturing the light emitting device according to claim 1, wherein the wiring layer comprises:

a first wiring on a surface of which the connection member of the connection members is disposed; and
a second wiring on a surface of which another connection member of the connection members is disposed.

9. The method of manufacturing the light emitting device according to claim 1, wherein a bottom surface of the wiring layer is disposed on a surface of the mounting board.

10. The method of manufacturing the light emitting device according to claim 9, wherein a top surface of the wiring layer is disposed on a bottom surface of the reflector of the reflectors.

11. The method of manufacturing the light emitting device according to claim 1, wherein a surface of the wiring layer abuts a surface of the mounting board and another surface of the wiring layer abuts a surface of the reflector of the reflectors.

12. The method of manufacturing the light emitting device according to claim 1, wherein the press-bonding jig presses the light emitting elements toward the mounting board such that the tops of the reflectors become co-planar with the upper surfaces of the light emitting elements.

13. The method of manufacturing the light emitting device according to claim 1, wherein the reflector of the reflectors is disposed on an upper surface of the wiring layer.

14. The method of manufacturing the light emitting device according to claim 13, wherein the connection member of the connection members is disposed on the upper surface of the wiring layer.

15. The method of manufacturing the light emitting device according to claim 13, wherein an inner peripheral wall surface of the reflector of the reflectors is inclined such that a cross-sectional area of the reflector of the reflectors increases as the reflector of the reflectors departs from the upper surface of the wiring layer.

16. A method of manufacturing a light emitting device, the method comprising:

temporarily connecting light emitting elements to a wiring layer through connection members, the wiring layer being disposed on a surface of the mounting board on which reflectors are mounted around each of the light emitting elements;

contacting a flat pressing surface of a press-bonding jig with upper surfaces of the light emitting elements and pressing the light emitting elements toward the mounting board to deform the connection members and to contact the flat pressing surface of the press-bonding jig with top surfaces of the reflectors; and removing the press-bonding jig and connecting the light emitting elements to the wiring layer through the connection members, wherein, when the light emitting elements are temporarily connected to the wiring layer, with respect to a top surface of the wiring layer, a sum of a height of a light emitting element of the light emitting elements and a height of a connection member of the connection members is more than a height of a reflector of the reflectors.

17. The method of manufacturing the light emitting device according to claim 16, wherein, when the light emitting elements are temporarily connected to the wiring layer, an upper surface of the light emitting element is positioned higher than the top surface of the reflector of the reflectors.

18. The method of manufacturing the light emitting device according to claim 16, wherein, prior to the removing the press-bonding jig, the flat pressing surface of the press-bonding jig abuts top surfaces of the reflectors and the upper surfaces of the light emitting elements.

19. The method of manufacturing the light emitting device according to claim 16, wherein a bottom surface of the wiring layer is disposed on the surface of the mounting board, and the top surface of the wiring layer is disposed on a bottom surface of the reflector of the reflectors.

20. The method of manufacturing the light emitting device according to claim 16, wherein the press-bonding jig presses the light emitting elements toward the mounting board such that top surfaces of the reflectors become co-planar with the upper surfaces of the light emitting elements.

* * * * *